(12) United States Patent
Geva et al.

(10) Patent No.: US 6,706,542 B1
(45) Date of Patent: Mar. 16, 2004

(54) APPLICATION OF INAIAS DOUBLE-LAYER TO BLOCK DOPANT OUT-DIFFUSION IN III-V DEVICE FABRICATION

(75) Inventors: Michael Geva, Allentown, PA (US); Yuliya Anatolyevna Akulova, Allentown, PA (US); Abdallah Ougazzaden, Breinigsville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 205 days.

(21) Appl. No.: 09/645,913

(22) Filed: Aug. 25, 2000

Related U.S. Application Data

(63) Continuation-in-part of application No. 09/540,471, filed on Mar. 31, 2000.
(60) Provisional application No. 60/120,821, filed on Jan. 7, 2000.

(51) Int. Cl.[7] .............................................. H01L 21/00
(52) U.S. Cl. ............................... 438/7; 438/31; 438/32; 438/518; 438/604; 438/761; 438/767; 438/403
(58) Field of Search ............................... 438/7, 31, 32, 438/518, 604, 761, 767, FOR 393, FOR 394, FOR 396

(56) References Cited

U.S. PATENT DOCUMENTS

| | | | | |
|---|---|---|---|---|
| 5,192,698 A | * | 3/1993 | Schuermeyer et al. | 438/169 |
| 5,258,632 A | * | 11/1993 | Sawada | 257/194 |
| 5,475,256 A | * | 12/1995 | Sawada et al. | 257/577 |
| 5,608,230 A | * | 3/1997 | Hirayama et al. | 257/18 |
| 5,753,933 A | * | 5/1998 | Morimoto | 257/14 |
| 5,788,799 A | * | 8/1998 | Steger et al. | 156/345.37 |
| 6,414,340 B1 | * | 7/2002 | Brar | 257/192 |
| 2001/0041379 A1 | * | 11/2001 | Sakata | 438/22 |

* cited by examiner

*Primary Examiner*—George Fourson
*Assistant Examiner*—Michelle Estrada
(74) *Attorney, Agent, or Firm*—Lester H. Birnbaum

(57) ABSTRACT

The present invention relates to a multi-layer dopant barrier and its method of fabrication for use in semiconductor structures. In an illustrative embodiment, the multi-layer dopant barrier is disposed between a first doped layer and a second doped layer. The multi-layer dopant barrier further includes a first dopant blocking layer adjacent the first doped layer and a second dopant blocking layer adjacent the second doped layer. A technique for fabricating the multi layer dopant barrier is disclosed. A first dopant blocking layer is formed at a first temperature, and a second dopant blocking layer is formed at a second temperature over the first barrier layer.

33 Claims, 4 Drawing Sheets

APPLICATION OF INAIAS DOUBLE-LAYER TO BLOCK DOPANT OUT-DIFFUSION IN III-V DEVICE FABRICATION

CROSS-REFERENCE TO RELATED APPLICATIONS

This present application claims priority of Provisional Application Ser. No. 60/120,821 filed Jan. 7, 2000. The present application is also a continuation-in-part application of U.S. patent application Ser. No. 09/540,471 filed on Mar. 31, 2000 and assigned to the assignee of the present invention. The disclosures of the above captioned applications are specifically incorporated herein by reference.

FIELD OF THE INVENTION

The present invention relates to a multi-layer dopant diffusion barrier for use in III–V semiconductor structures.

BACKGROUND OF THE INVENTION

Optical communications systems employ a variety of optoelectronic devices. Some of these optoelectronic devices incorporate a structure in which an intrinsic (i) semiconductor layer is disposed between a p-type layer and an n-type layer. This structure is commonly referred to as a PIN structure and the devices as PIN devices. The PIN structure has properties which are useful in optoelectronic devices. For example, the intrinsic layer may have a larger index of refraction than the p and n layers. In this way, a waveguide can be formed, with the p and n layers being cladding layers and the intrinsic layer being the guiding layer of the waveguide. Furthermore, energy band discontinuities in the conduction and valence bands in the PIN structure facilitate carrier confinement within the intrinsic layer, which is useful in many devices. In short, the PIN structure is well suited for a variety of light emitting and detecting optoelectronic device applications.

One material that is used often in PIN devices is indium phosphide (InP). In a PIN structure employing InP, the p-type layer is often fabricated by introducing zinc as a dopant. Although a suitable dopant for forming the p-type layer, zinc can readily diffuse out of the p-type layer due to the higher temperature achieved during the growth of InP.

In addition, many optoelectronic devices are based on a structure commonly known as a buried mesa structure. Often a PIN structure is part of the mesa, and the mesa is disposed between current blocking layers. The current blocking layers provide transverse optical and carrier confinement. In many structures, one or more of the current blocking layers is semi-insulating, iron doped indium phosphide (InP(Fe)). Unfortunately, inter-diffusion of p-dopants from the p-type layer and iron from the semi-insulating InP(Fe) layer may occur. This inter-diffusion may have detrimental effects on device characteristics. The diffusion of the p-type dopants from the p-type layer can result in leakage current in the device; and the diffusion of the iron dopants into the p-type layer can make the p-type layer more resistive. Accordingly, it is desirable to have a barrier layer to prevent the inter-diffusion.

In some conventional structures, an n-InP layer can be used as a dopant barrier layer. The n-InP layer may be disposed between the mesa and the current blocking layers in a buried mesa structure. This is shown in FIG. 5. An n-InP dopant barrier layer 501 is disposed between the mesa 502 and InP(Fe) current blocking layers 503. However, the dopant concentration in the n-InP barrier layer 501 may be relatively high (on the order of about $10^{18}$–$10^{19}$ atoms/cm$^3$) to prevent diffusion of p-type dopants out of the p-type layer 504. Additionally, to ensure appropriate blocking of the dopants, it may be necessary to make the n-InP layer 501 relatively thick, on the order of tens of nanometers. Accordingly, a parasitic pn junction may be formed between the p-type layer 504 and n-type dopant barrier layer 501. This can cause an undesired current leakage path. Moreover, the disposition of the n-type dopant barrier layer 501 between the p-type cladding layer 504 and the current blocking layers 503 can result in an undesired parasitic capacitance component. Parasitic capacitance may be particularly problematic in devices such as electro-absorptive modulators, lasers and digital devices, in general, as it adversely impacts device speed.

Accordingly, what is needed is a dopant diffusion barrier, which effectively blocks diffusion of dopants, while not introducing parasitic elements, such as pn junctions and capacitance, to the device.

SUMMARY OF THE INVENTION

The present invention relates to a multi-layer dopant barrier and its method of fabrication for use in semiconductor structures. In an illustrative embodiment, the multi-layer dopant barrier is disposed between a first doped layer and a second doped layer. The multi-layer dopant barrier further includes a first dopant blocking layer adjacent the first doped layer and a second dopant blocking layer adjacent the second doped layer.

In another illustrative embodiment, a technique for fabricating the multi-layer dopant barrier is disclosed. A first dopant blocking layer is formed at a first temperature, and a second dopant blocking layer is formed at a second temperature over the first barrier layer.

In the illustrative embodiments of the present invention, dopant diffusion is significantly reduced. Moreover, parasitic pn junctions and parasitic capacitance of the above discussed prior art are substantially avoided.

BRIEF DESCRIPTION OF THE DRAWING

The invention is best understood from the following detailed description when read with the accompanying drawing figures. It is emphasized that in accordance with the standard practice in the semiconductor industry the various features are not necessarily drawn to scale. In fact, the dimensions of the various features may be arbitrarily increased or reduced for clarity of discussion.

DETAILED DESCRIPTION OF THE INVENTION

Figure 1:
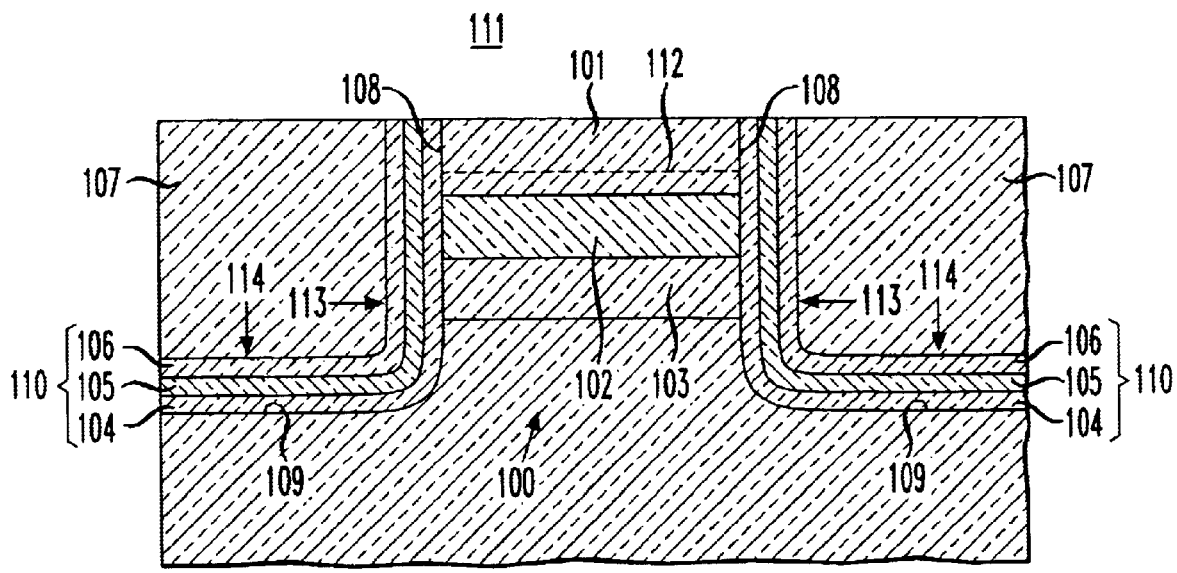
FIG. 1 is a cross-sectional view of an exemplary embodiment including the multi-layer dopant diffusion barrier layer of the present invention.

The present invention will be described more fully with reference to accompany drawing figures in which exemplary embodiments of the present invention are described. Referring initially to FIG. 1, one such embodiment, including a mesa PIN structure 111, is shown. A substrate 100 has an n-type semiconductor layer 103 disposed thereover. An active layer 102 of intrinsic semiconductor is disposed over the n-type layer 103, and a p-type semiconductor layer 101 is disposed over the active layer 102. The mesa PIN structure 111 is disposed between current blocking or confinement layers 107. A multi-layer dopant diffusion barrier layer 110, illustratively including a first dopant blocking layer 104 and a second dopant blocking layer 106, is disposed between the mesa 111 and each of the current blocking layers 107.

In the exemplary embodiment shown in FIG. 1, the first dopant blocking layer 104 is contiguous with vertical side 108 of the mesa 111 and blocks p-type dopants from diffusing out of the p-type layer 101. Similarly, the second dopant blocking layer 106 is contiguous with, and prevents dopants from diffusing out of, the current blocking layer 107. However, it is of interest to note that first dopant blocking layer 104 and second dopant blocking layer 106 need not be contiguous to p-type layer 101 and current blocking layer 107, respectively. In fact, it is possible that the first dopant blocking layer 104 is adjacent to the p-type layer 101, with one or more layers of suitable material disposed between the first dopant blocking layer 104 and the p-type layer 101. Similarly, it is possible that the second dopant blocking layer 106 is adjacent to the current blocking layer 107, with one or more layers of suitable material disposed between second dopant blocking layer 106 and the current blocking layer 107. Moreover, a third dopant blocking layer 105 may be disposed between current blocking layers 107 and the mesa 111 to further aid in preventing dopants from diffusing out of the current blocking layers 107 and into the mesa. Finally, as is discussed in detail below, the first dopant blocking layer 104 and the second dopant blocking layer 106 of the present invention illustratively are like compounds, but have different properties which are exploited to provide clear advantages over the prior art These differences in properties are believed to be attributable to the temperature at which they are grown, with layer 104 being grown at a lower temperature than layer 106.

In the illustrative embodiment shown in FIG. 1, the substrate 100 is illustratively n-type, for example n-type indium phosphide (n-InP). The n-type layer 103 (also referred to as the lower cladding layer) is illustratively n-doped InP. The active layer 102 is illustratively intrinsic InGaAsP. The p-type layer 101 (also referred to as the upper cladding layer) is illustratively p-doped InP. In the exemplary embodiment, zinc is used as the p-type dopant in layer 101, although other dopants such as Cd, Mg and Be may be used in this capacity. Illustratively, the current blocking layers 107 are disposed on either side of the mesa 111, effecting a buried ridge structure. Alternatively, it is possible that current blocking layer 107 substantially surrounds the mesa. This would be useful in a surface emitting device, for example. In either case, an exemplary material for current blocking layers 107 is semi-insulating InP(Fe).

First dopant blocking layer 104 and second dopant blocking layer 106 in the exemplary embodiment shown in FIG. 1 are indium aluminum arsenide (InAlAs).

The use of InAlAs is illustrative, and other materials may be used for the first and second dopant blocking layers 104 and 106, respectively, to prevent dopants from diffusing out of layers 101 and 107. The alternative materials would be chosen to suitably block dopant diffusion from layers 101 and 107, but would not form a parasitic pn junction with layer 101, for reasons discussed above. These include, for example, InAlGaAs, and may be formed by the illustrative techniques described below.

In keeping with the teaching of the above captioned parent application, a dopant barrier 112 may be used to prevent p-type dopants from diffusing out of the p-type layer 101 and into the active layer 102. Dopant barrier 112 may be as set forth in the parent application. Alternatively, dopant barrier 112 may be aluminum spikes or aluminum containing spikes as set forth in U.S. patent application Ser. No. 09/540,474 filed Mar. 31, 2000. This application is assigned to the assignee of the present invention, and its disclosure is specifically incorporated by reference herein.

The present invention is applicable to a variety of electronic devices. Illustrative devices include, but are not limited to, optoelectronic devices such as semiconductor lasers, electro-absorptive modulators, and detectors. A variety of materials, to include III–V semiconductors, may be used to fabricate heterostructure devices using the present invention. For example, materials that can be used to form the heterostructure of layers 101, 102, 103, include, but are in no way limited to, GaAs, GaP, InGaAsP and InGaAs. The active layer 102 may be a single intrinsic layer, or a single quantum layer, depending on the ultimate device sought. Moreover, it is clear that multiple heterojunction structures such as superlattice structures, or multi quantum well (MQW) structures may be used for the active layer 102. As would be readily understood by one having ordinary skill in the art, the particular materials chosen, as well as the chosen stoichiometry may depend upon device application and desired characteristics. Such choices of materials and stoichiometry would be within the purview of one having ordinary skill in the art, and as such need not be discussed in further detail.

In the exemplary embodiment shown in FIG. 1, the first dopant blocking layer 104 is effective in preventing diffusion of p-type dopants out of the p-type cladding layer 101. This illustrative layer of InAlAs is grown by standard technique such as metal organic vapor phase epitaxy (MOVPE). The growth temperature is in the range of approximately 500° C. to approximately 570° C.; illustratively 530° C. Alternatively, the first dopant blocking layer 104 of InAlAs may be grown by molecular beam epitaxy (MBE). In the illustrative embodiment using MBE, the growth temperature when growing the first dopant barrier layer 104 is in the range of approximately 400° C. to approximately 470° C.; illustratively 430° C. By either technique, growth at the illustrative lower temperatures provides advantageous material properties to layer 104, as well as allowing a suitable thickness to be grown. To this end, growth of the illustrative InAlAs layer 104 at lower temperatures is believed to foster growth of a layer having a relatively high resistivity. In addition the lower temperature growth is believed to foster growth of a layer having sufficient thickness to aid in preventing p-type dopants from diffusing out of the p-type layer 101 and into the burying layers 107. Finally, it is of interest to note that MOVPE and MBE are illustrative techniques for forming layer 104 at low temperatures. Clearly, other techniques known in the art may be used to fabricate layer 104 to achieve its desired characteristics described herein.

Applicants believe, without wishing to be bound to their theory, that the greater the kinetic energy of the growth species, the greater the probability that the diffusion along a vertical growth surface (such as vertical sidewall 108) will occur. This diffusion of the growth species at higher growth temperatures may retard growth along the vertical sidewall 108 resulting in a thinner layer's being grown along the vertical sidewall 108. At the same time due to the higher temperature growth, a thicker layer may be grown along the horizontal surface 109 of the substrate. However, because of the relatively low growth temperatures used in growing layer 104 in the exemplary embodiment of FIG. 1, a layer of InAlAs having a thickness in the illustrative range of approximately 50 nm to approximately 100 nm, may be achieved along the vertical (e.g., (011) crystallographic plane) sidewall 108 of the mesa 111. Moreover, because of the reduction in diffusion along the sidewall 108 as a result of the lower growth temperature, the growth rate of the portion of layer 104 along the vertical sidewall 108 is substantially the same as the growth rate of the portion of layer 104 along the horizontal (e.g., (100) crystallographic plane) surface 109 of the substrate. As a result, layer 104 has a substantially equal thickness along its vertical and horizontal portions. Applicants believe that this ability to grow layer 104 relatively thickly along the vertical sidewall 108 of the mesa 111 aids in current confinement in the device of the mesa PIN structure 111.

In addition to the desirable thickness of the portion of the layer 104 along the vertical sidewall 108, the first dopant blocking layer 104 of the exemplary embodiment has an increased resistivity compared to a like material grown at higher temperatures. For example, in the illustrative embodiment, the InAlAs layer 104 is semi-insulating, and has a resistivity in the range of approximately $10^6$ Ohm-cm to approximately $10^9$ Ohm-cm. As discussed herein, InAlAs grown by the same technique at a higher temperature has a lower resistivity. This greater resistivity in layer 104 is believed to aid in current confinement in buried structure devices. Accordingly, leakage current may be reduced in devices incorporating the present invention. This can improve device performance and reliability. Again, without wishing to be bound, applicants believe that due to the comparatively low temperature at which layer 104 is grown, ambient oxygen does not evaporate and may bond to the aluminum forming deep level traps. Also, carbon may be introduced into the material during the low temperature growth sequence. The bonding of the oxygen to the aluminum and the carbon compensation at low temperature may both serve to increase the resistivity.

Figure 2:
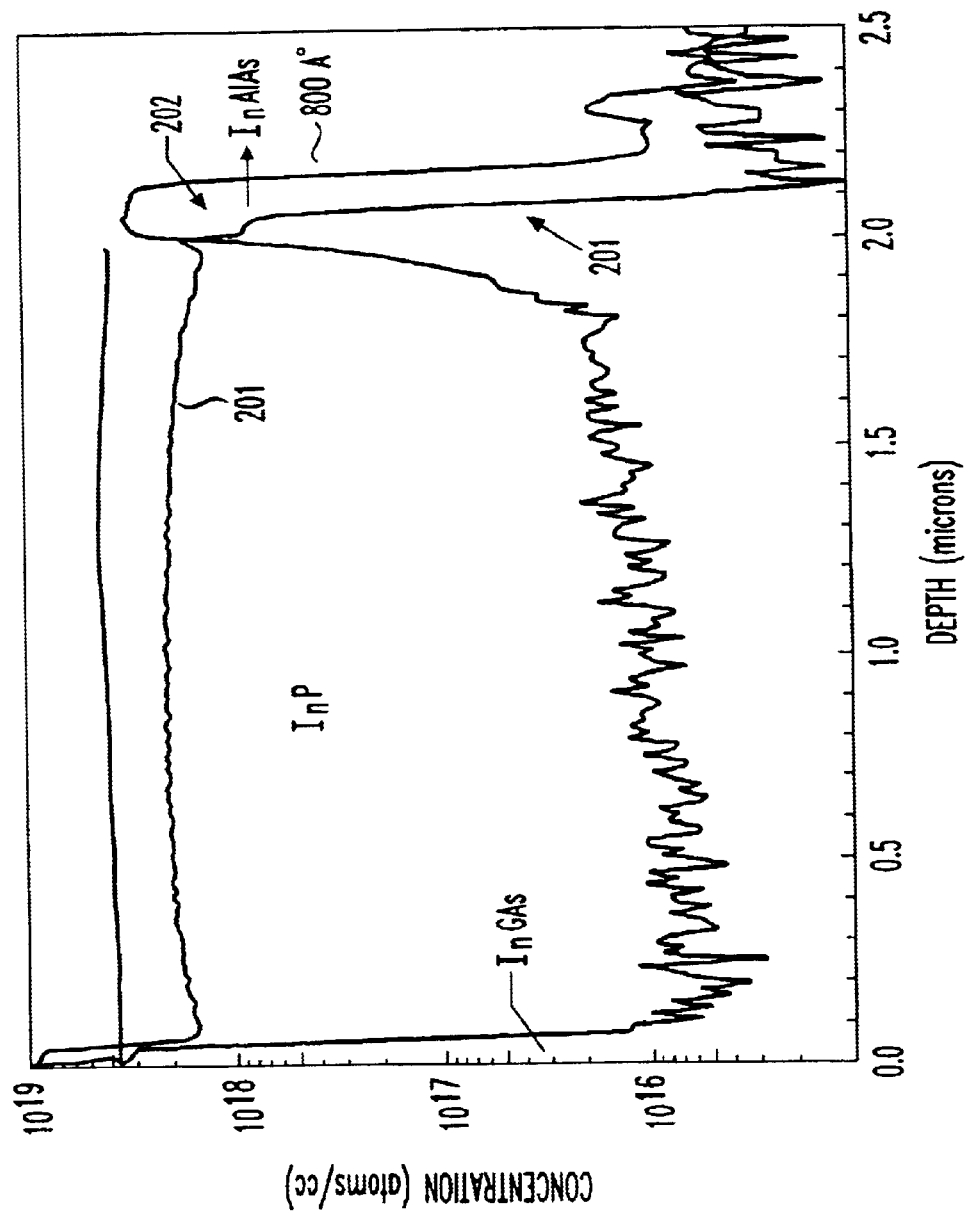
FIG. 2 is a graphical representation showing the blocking of zinc dopants by the first dopant blocking layer of an exemplary embodiment of the present invention.

The diffusion blocking characteristics of the first dopant blocking layer 104 can be seen most readily from a review of FIG. 2. To this end, the concentration of the illustrative dopant, Zn, shown at 201, is relatively high in the layer of type InP (on the order of about $\times 10^{18}/cm^3$). However, the concentration of Zn drops off significantly in the illustrative dopant blocking layer InAlAs layer 202, grown at low temperature as discussed above. The illustrative layer of InAlAs shown in FIG. 2 is about 800 Å thick, and as can be seen, the concentration of Zn drops off to minimal levels.

While the first dopant blocking layer 104 of InAlAs grown at low temperature is a suitable material to prevent the diffusion of p-type dopants from layer 101, this material may not be suitable to prevent the diffusion of dopants out of layer 107. To this end, in the illustrative embodiment in FIG. 1, iron doped indium phosphide is used for the current blocking layer/confinement layer 107. As is known, iron doped indium phosphide is a suitable material to provide both current and optical confinement in buried mesa structure devices. However, the diffusion of iron dopants into the mesa structure 104 and in particular into layer 101 can have deleterious effects on the performance characteristics of a device. Unfortunately, the low-temperature InAlAs first dopant blocking layer 104 may not be suitable for blocking iron dopants from current blocking layer 107. Applicants have found, however, that when InAlAs is grown at a higher temperature, it can effectively prevent the diffusion of iron out of layer 107, and into the mesa 111. To this end, in the illustrative embodiment of the present invention, layer 106 is grown by MOVPE at a temperature on the order of approximately 600° C. to approximately 650° C.; illustratively 630° C. Alternatively, layer 106 may be grown by MBE at an illustrative growth temperature of approximately 500° C. to approximately 550° C.; illustratively 530° C.

By either MOVPE or MBE, when grown at higher growth temperatures, the InAlAs growth rate is slower along the vertical portion 113 of the layer 106 than along the horizontal portion 114 of the layer. Again, this follows from the kinetic energy of the growth species as discussed above. Accordingly, the vertical portion 113 of layer 106 tends to be 3–10 times thinner than the horizontal portion 114. Applicants have found that the thickness grown along vertical portion 113 of layer 106 is sufficient to effectively block the diffusion of iron dopants out of the current confinement layer 107. To this end, layer 106 has an illustrative thickness on the order of approximately 30 nm to approximately 100 nm along its vertical portion 113. Finally it is of interest to note that MOVPE and MBE are illustrative techniques for forming layer 106 at high temperatures. Clearly other techniques know in the art may be used to fabricate layer 106 at to achieve its desired characteristics described herein.

In addition to its ability to suitably block iron dopants from diffusing out of the blocking layers 107, the second dopant blocking layer 106 is not very resistive, having a resistivity in the range approximately $10^4$ Ohm-cm to $10^5$ Ohm-cm. However, the second dopant barrier layer, while having a relatively low resistivity, does not adversely impact the current blocking ability of layer 107, since it is substantially isolated electrically from the mesa 111 and from the n-InP substrate 100.

Figure 3:
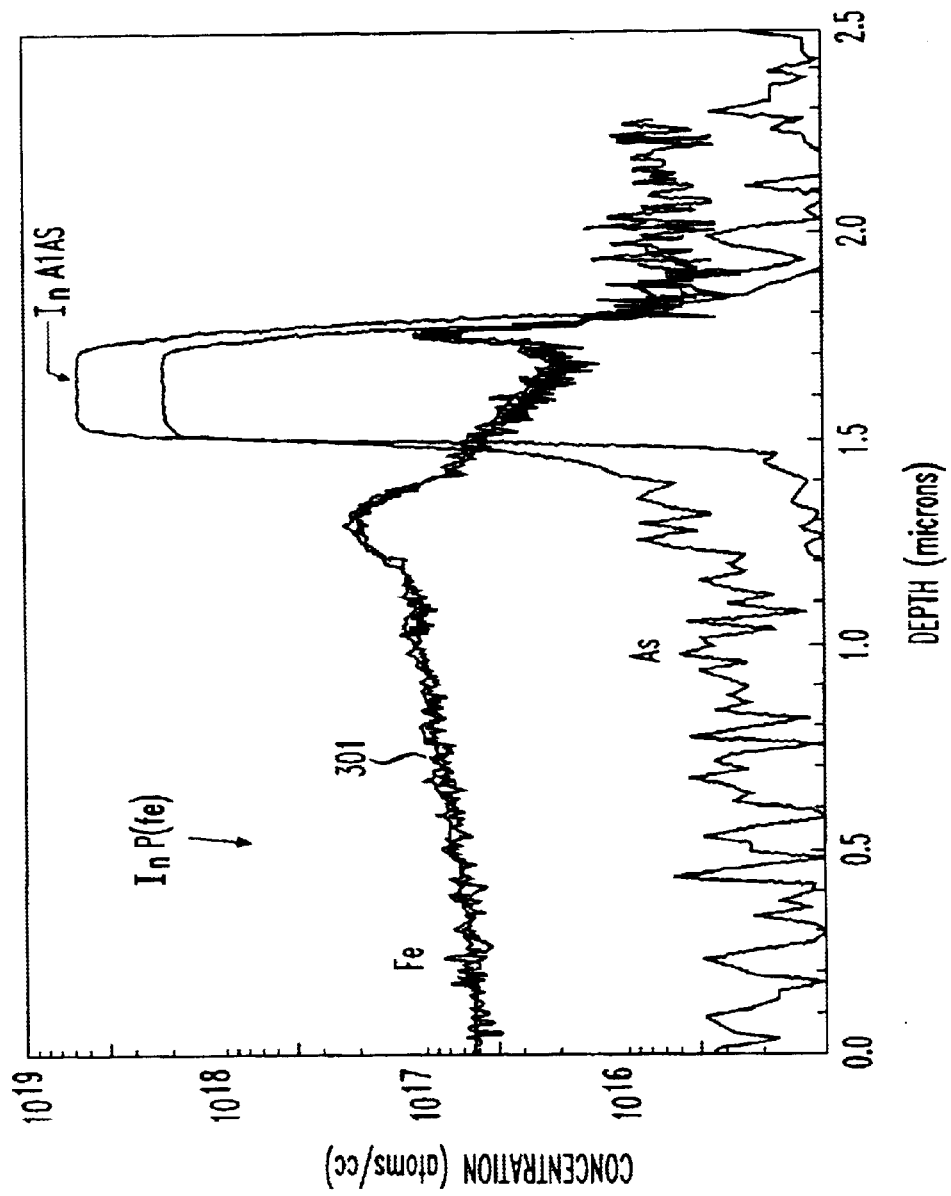
FIG. 3 is a graphical representation showing the blocking of iron dopants by the second dopant blocking layer of an exemplary embodiment of the present invention.
Figure 5:
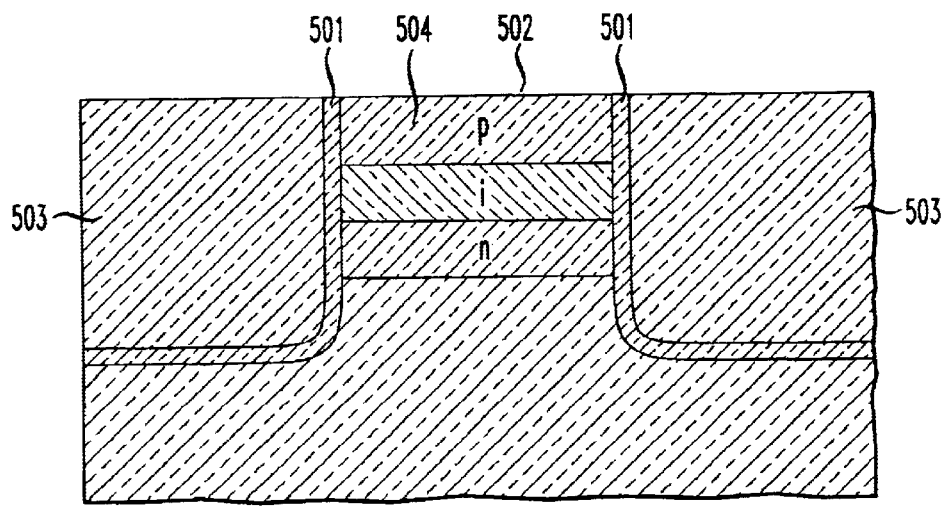
FIG. 5 is a cross-sectional view of a conventional dopant barrier layer used in a buried mesa PIN structure.

The dopant diffusion blocking capability is shown graphically in FIG. 3. In this illustrative embodiment, the Fe concentration 301 is on the order of $10^{16}$ cm$^{-3}$ to $10^{17}$ cm$^{-3}$ in the InP(Fe) blocking layer. However, as can be seen, the iron concentration drops significantly in the InAlAs layer grown at the exemplary high temperatures of the present invention.

In the illustrative embodiment shown in FIG. 1, a third dopant blocking layer 105 may be used. The third dopant blocking layer 105 is illustratively a layer of InP based material grown between layers 104 and 106. In the exemplary embodiment, third dopant blocking layer 105 is undoped InP. Alternatively, layer 105 may be undoped InGaP, InGaAs or InGaAsP. Third dopant blocking layer 105 is grown by conventional technique, such as MOVPE or MBE, and adds certain advantages. Applicants theorize, without wishing to be bound to their theory, that in addition to the intrinsic properties of the materials used for diffusion blocking layers, interfaces between layers are believed to assist in blocking dopant diffusion. Accordingly, the third dopant blocking layer 105 of undoped InP (or InP-based material) disposed between layers 104 and 106 adds two hetero-interfaces to the multi-layer dopant diffusion barrier layer 110. In the illustrative embodiment of the present invention, this layer has a thickness on the order of approximately 10 nm to approximately 100 nm.

The third dopant blocking layer 105 may be slightly n-doped (n-type). Illustratively, layer 105 is an n-InP layer having a thickness in the range of approximately 10 nm to approximately 100 nm; having a doping concentration in the range of approximately $1-5\times10^{17}$ cm$^{-3}$. Accordingly, it may further aid in the blocking of zinc and iron diffusion in the illustrative embodiment. In contrast to prior art n-InP dopant blocking layers, if layer 105 of the present invention is n-type, it will not form a parasitic pn junction, since it is not in contact with a p-type layer, such as upper cladding layer 101. Moreover, because it is electrically isolated from the n-type substrate 100, it will not provide a leakage current path. Finally, because layer 105 is relatively thin and only slightly doped n-type, it does not add significantly any parasitic capacitance component to a device.

Figure 4:
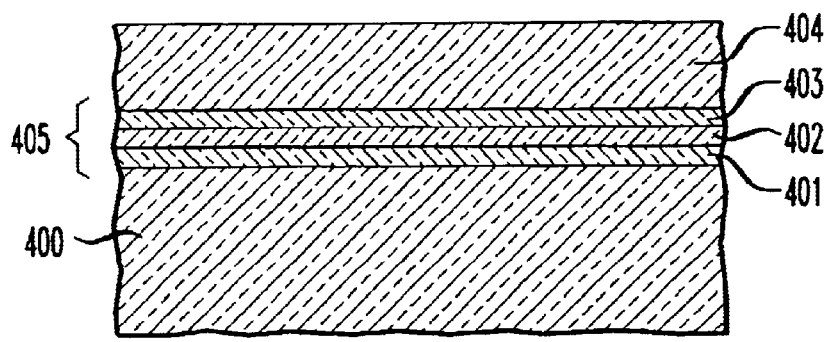
FIG. 4 is a cross-sectional view of an exemplary embodiment including the multi-layer dopant diffusion barrier of the present invention.

Turning to FIG. 4, another embodiment of the present invention is shown. In this structure, a first doped layer 400 (for example a substrate) may be a semi-insulating layer, such as InP(Fe), and a second doped layer 404 may be p-type such as p-InP. In such a structure, a multi-layer dopant barrier 405, having a first dopant blocking layer 403 and a second dopant blocking layer 401, is disposed between layers 400 and 404. Consistent with the discussion surrounding the embodiment of FIG. 1, second dopant blocking layer 401 in the embodiment of FIG. 4, is illustratively a layer of InAlAs grown at high temperature and having a suitable thickness to block dopants, such as Fe from diffusing out of the substrate 400. Also consistent with the teaching surrounding the exemplary embodiment of FIG. 1, first dopant blocking layer 403 is illustratively a layer of InAlAs grown at low temperature and thickness to block p-type dopants (such as Zn) from diffusing out of layer 404. Third dopant blocking layer 402 is illustratively a layer of undoped or slightly n-type InP and may be used optionally, as discussed above. The materials and techniques used to fabricate the structure of FIG. 4 are consistent with the disclosure surrounding the multi-layer dopant barrier of the illustrative embodiment of FIG. 1 and are omitted in this portion of the disclosure of the invention in the interest of brevity.

Finally, it is of interest to note that there are conceivably structures in which the substrate 400 is p-type (such as p-InP) and layer 404 is a semi-insulating material (such as InP(Fe)). As such, the multi-layer dopant blocking layer 405 may be used, except that layer 403 illustratively would be a dopant blocking layer suitable for blocking dopant diffusion out of the semi-insulating layer (such as InAlAs grown at high temperature). Layer 401 would be a layer dopant blocking layer suitable for blocking p-type dopants (such as InAlAs grown at low temperature).

The invention having been described in detail, those skilled in the art should understand that they can make various changes, substitutions and modifications thereto without departing from the theme and spirit of the invention in its broadest form. To the extent that such changes, substitutions and modifications result in a multi-layer dopant barrier in accordance with the present disclosure, such are deemed within the scope of the appended claims.

What is claimed:

1. A process for fabricating an electronic device, the process comprising:
   (a) forming a first dopant blocking layer at a first temperature; and
   (b) forming a second dopant blocking layer at a second temperature over said first dopant blocking layer,
   said first and second dopant blocking layers being disposed between a semi-insulating layer and a p-type layer.

2. A process as recited in claim 1, wherein said first temperature is lower than said second temperature.

3. A process as recited in claim 1, wherein the process further comprises:
   forming a third dopant blocking layer between said first and said second dopant blocking layers.

4. A process as recited in claim 1, wherein said first dopant blocking layer is formed over a vertical sidewall of a mesa and over a horizontal surface of a substrate; and
   said first dopant blocking layer has a substantially uniform thickness.

5. A process as recited in claim 1, wherein said first and said second blocking layers are InAlAs.

6. A process as recited in claim 3, wherein said third dopant blocking layer is chosen from the group consisting essentially of InP, InGaP, InGaAs, or InGaAsP.

7. A process as recited in claim 1, wherein said first temperature lies in the range of approximately 500° C. to approximately 570° C.

8. A process as recited in claim 4, wherein said thickness is in the range of approximately 50 nm to approximately 100 nm.

9. A process as recited in claim 1, wherein said second dopant blocking layer has a vertical portion and said vertical portion has a thickness in the age of approximately 30 nm to approximately 100 nm.

10. A process as recited in claim 1, wherein said first and second dopant blocking layers are InGaAlAs.

11. A process as recited in claim 1, wherein said first dopant blocking layer is disposed above a p-type layer and said second dopant blocking layer is disposed below a semi-insulating layer.

12. A process a recited in claim 1, wherein said first dopant blocking layer is disposed below a p-type layer and said second dopant blocking layer is disposed above a semi-insulating layer.

13. A process for fabricating an optoelectronic device as recited in claim 1, wherein said second temperature lies in the range of approximately 600° C. to approximately 650° C.

14. A process as recited in claim 1, wherein said first and said second dopant blocking layers are formed by MOVPE.

15. A process as recited in claim 1, wherein said first and said second dopant blocking layers are formed by MBE.

16. A process as recited in claim 15, wherein said first temperature lies in the range of approximately 400° C. to approximately 470° C.

17. A process as recited in claim 15, wherein said second temperature lies in the range of approximately 500° C. to approximately 550° C.

18. A process as recited in claim 14, wherein said first temperature is in the range of approximately 500° C. to approximately 570° C.

19. A process as recited in claim 14, wherein said second temperature lies in the range of approximately 600° C. to approximately 650° C.

20. A process for fabricating an electronic device, the process comprising:
   (a) forming a first InAlAs layer at a first temperature; and
   (b) forming a second InAlAs layer at a second temperature over said first InAlAs layer,
   said first and second InAlAs layers being disposed between a semi-insulating layer and a p-type layer.

21. A process as recited in claim 20, wherein said first temperature is lower than said second temperature.

22. A process as recited in claim 20, wherein the process further 2 comprises: forming a layer of undoped InP between said first and said second InAlAs layers.

23. A process as recited in claim 20, wherein said first InAlAs layer is formed over a vertical sidewall of a mesa and over a horizontal surface of a substrate; and
   wherein said first InAlAs layer has a substantially uniform thickness.

24. A process as recited in claim 20, wherein said first InAlAs layer is disposed above a p-type layer and said second InAlAs layer is disposed below a semi-insulating layer.

25. A process a recited in claim 20, wherein said first InAlAs layer is disposed below a p-type layer and said second InAlAs layer is disposed above a semi-insulating layer.

26. A process for fabricating an electronic device as recited in claim 20, wherein said second temperature lies in the range of approximately 600° C. to approximately 650° C.

27. A process as recited in claim 20, wherein said first temperature lies in the range of approximately 500° C. to approximately 570° C.

28. A process as recited in claim 20, wherein said first and said second dopant blocking layers are formed by MOVPE.

29. A process as recited in claim 20, wherein said first temperature lies in the range of approximately 400° C. to approximately 470° C.

30. A process as recited in claim 20, wherein said second temperature lies in the range of approximately 500° C. to approximately 550° C.

31. A process as recited in claim 20 wherein said first and said second dopant blocking layers are formed by MBE.

32. A process as recited in claim 1 wherein the p-type layer includes a Zn dopant, and the semi-insulating layer includes an Fe dopant.

33. A process as recited in claim 20 wherein the p-type layer includes a Zn dopant, and the semi-insulating layer includes an Fe dopant.

* * * * *